(12) United States Patent
Hsu et al.

(10) Patent No.: US 6,549,450 B1
(45) Date of Patent: Apr. 15, 2003

(54) METHOD AND SYSTEM FOR IMPROVING THE PERFORMANCE ON SOI MEMORY ARRAYS IN AN SRAM ARCHITECTURE SYSTEM

(75) Inventors: Louis L. Hsu, Fishkill, NY (US); Rajiv V. Joshi, Yorktown Heights, NY (US); Fariborz Assaderaghi, Mahopac, NY (US); Mary J. Saccamango, Poughquag, NY (US)

(73) Assignee: IBM Corporation, Armonk, NY (US)

( * ) Notice: Subject to any disclaimer, the term of this patent is extended or adjusted under 35 U.S.C. 154(b) by 229 days.

(21) Appl. No.: 09/708,142

(22) Filed: Nov. 8, 2000

(51) Int. Cl.$^7$ .............................................. G11C 11/00
(52) U.S. Cl. ...................... 365/154; 365/156; 365/165
(58) Field of Search ................................. 365/154, 165, 365/176, 180, 156

(56) References Cited

U.S. PATENT DOCUMENTS

| 5,770,881 | A | * | 6/1998 | Pelella et al. | ............... | 257/347 |
| 5,943,258 | A | * | 8/1999 | Houston et al. | ............ | 365/154 |
| 6,177,300 | B1 | * | 1/2001 | Houston et al. | ............ | 438/149 |
| 6,229,161 | B1 | * | 5/2001 | Nemati et al. | ............... | 257/133 |

OTHER PUBLICATIONS

*SRAM Bitline Circuits on PD SOI: Advantages and Concerns* by Jente B. Kuang et al., IEEE Journal of Solid–State Circuits, vol. 32, No. 6, Jun. 1997.
*Floating–Body Effects in Partially Depleted SOI CMOS Circuits*, Pong–Fei Lu et al., IEEE Journal of Solid–State Circuits, vol. 32, No. 8, Aug. 1997.

* cited by examiner

*Primary Examiner*—Richard Elms
*Assistant Examiner*—Hien Nguyen
(74) *Attorney, Agent, or Firm*—Dilworth & Barrese, LLP

(57) ABSTRACT

The present invention provides an SOI SRAM architecture system which holds all the bitlines at a lower voltage level, for example, ground, or a fraction of Vdd, during array idle or sleep mode. Preferably, the bitlines are held at a voltage level approximately equal to Vdd minus Vth, where Vth represents the threshold voltage of the transfer devices of the SRAM cells. This prevents the body regions of the transfer devices of each cell of the array from fully charging up, and thus the system avoids the parasitic bipolar leakage current effects attributed to devices fabricated on a partially-depleted SOI substrate. Also, during idle or sleep mode, if all the bitlines are kept at about the Vdd minus Vth voltage level, power consumption by the SRAM architecture system is decreased. This is because the leakage path via one of the transfer gates of all the SRAM cells is greatly minimized. In the SOI SRAM architecture system of the present invention, before the SOI SRAM array is first accessed following the idle or sleep mode, the bitlines are quickly brought up to Vdd. Accordingly, there will not be sufficient time for the SOI body regions of the transfer devices to be charged up. Following access of the array, if the array becomes idle for a period of time, the bitlines are discharged to a lower voltage level again. To realize this, the SOI SRAM architecture system of the present invention includes circuitry for receiving at least one signal indicative of the operating mode of the array and for charging and discharging the array bitlines accordingly.

18 Claims, 2 Drawing Sheets

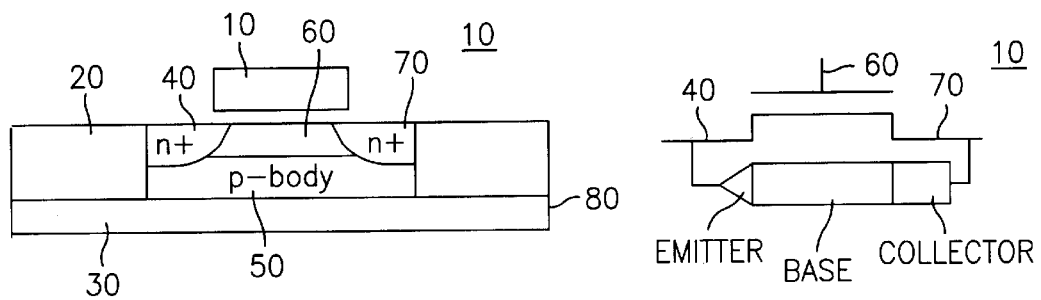
FIG. 1A
(PRIOR ART)
FIG. 1B
(PRIOR ART)
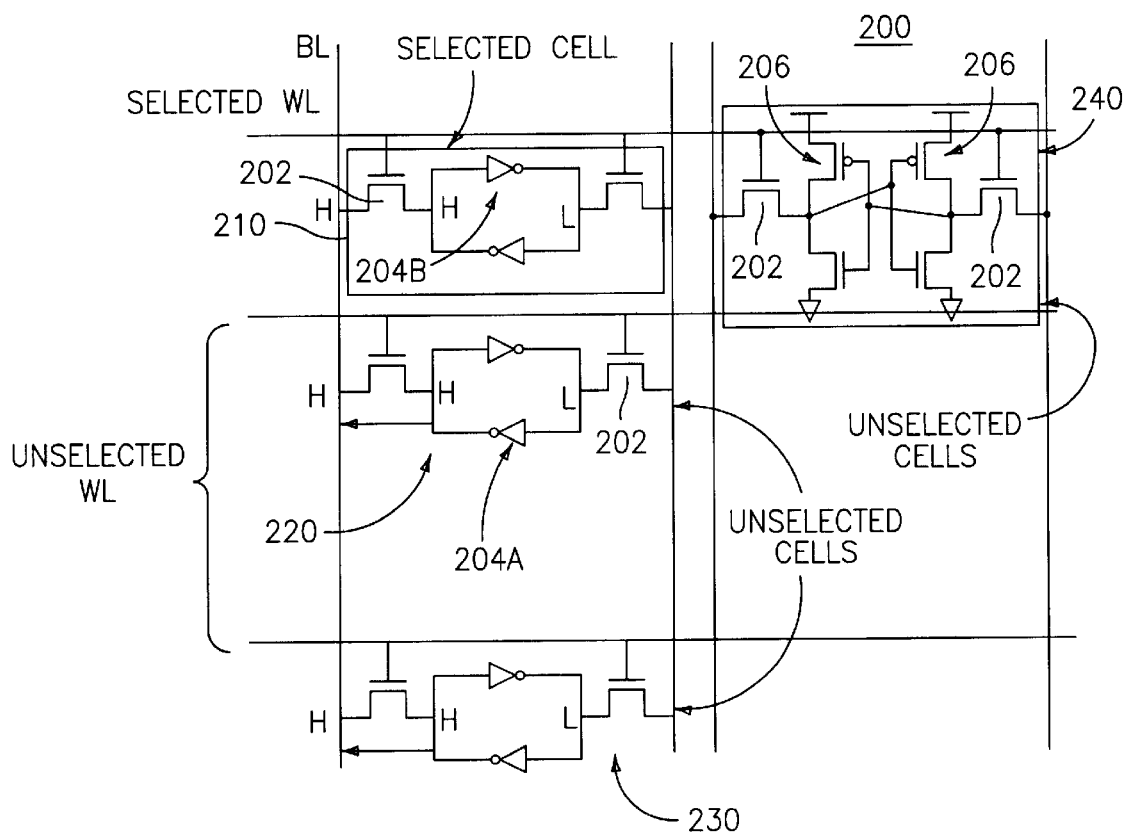
FIG. 2
(PRIOR ART)

METHOD AND SYSTEM FOR IMPROVING THE PERFORMANCE ON SOI MEMORY ARRAYS IN AN SRAM ARCHITECTURE SYSTEM

FIELD OF THE INVENTION

This invention relates to the field of integrated circuit (IC) design. Specifically, it relates to a method and system for improving the performance of silicon-on-insulator (SOI) memory arrays in an static random access memory (SRAM) architecture system.

BACKGROUND OF THE INVENTION

Each memory cell in a static random access memory (SRAM) chip is a buffer or flip-flop, and data is retained as long as power is maintained to the chip. SRAMs are realized with a bipolar technology, such as TTL, ECL, or I²L or with MOS technology, such as NMOS or CMOS. Bipolar SRAMs are relatively fast, having access times of 2 to 100 nsec. Power dissipation is also high, typically, 0.1 to 1.0 mW/bit. By contrast, MOS RAM access time is typically 100 nsec and power dissipation is 25 µW/bit. The combination of high circuit density, low power dissipation, and reasonable access time has led to the dominance of MOS technology in the manufacture of RAM. Hence, SRAMs having high-speed buffers are widely used in devices and equipment necessitating high-speed and high performance, such as microprocessors, communication networks, facsimile machines, modems, etc.

The performance of SRAM chips has also been significantly enhanced by the use of partially depleted silicon-on-insulator (SOI), i.e., PD-SOI, wafers in the fabrication thereof SOI wafers include an electrically insulating oxide film bonded to the active layer. It has been demonstrated that the use of PD-SOI substrate in the fabrication of an SRAM chip results in a 20–30% performance enhancement of the SRAM chip. This performance enhancement is attributed to the lowering of device junction capacitance and dynamic threshold voltage due to raised body potential. Accordingly, PD-SOI circuits have a better current drive and a higher transconductance than non-SOI circuits which leads to the performance enhancement.

Furthermore, circuits fabricated on PD-SOI have become more and more popular than circuits fabricated on a fully depleted SOI substrate. This is because the threshold voltage of devices fabricated on PD-SOI is easier to control than devices fabricated on a fully depleted SOI. Hence, devices fabricated on PD-SOI have a better short channel effect and require less quality control procedures during manufacturing.

A PD-SOI MOS device is illustrated by FIG. 1A and designated generally by reference numeral 10. A circuit diagram of the PD-SOI MOS device 10 is illustrated by FIG. 1B. The device 10 is completely isolated by shallow trench 20 on both sides, and buried oxide layer 30 at the bottom. Body region 50 of the PD-SOI MOS device 10 is underneath the source 40, channel 60, and drain 70 regions.

Due to the existence of the body region 50, it appears that the PD-SOI MOS device 10 is connected in parallel with a lateral parasitic bipolar device 80 underneath. As illustrated by FIG. 1B, the body 50 and source 40 regions form the base-emitter junction of the bipolar, while the body 50 and drain 70 regions forms the base-collector junction.

Since the body region 50 of the PD-SOI MOS device 10 is not tied to any voltage level, i.e., commonly described as being "left floating", it is known to cause some circuit behavior problems under certain circumstances. For example, when the source 40 and drain 70 regions of the PD-SOI MOS device 10 are both stressed at a high voltage, e.g., a voltage greater than 1.8 volts, after a few milli-seconds, the p-type body region 50 of the PD-SOI device 10 is also charged up to about the same voltage level. When the source region 40 of the device 10 is suddenly dropped to ground, the forward-biased body-source junction (or base-emitter junction) will turn on the parasitic bipolar device 80 underneath the body region 50 and cause an unexpected parasitic bipolar leakage current flow.

If the PD-SOI MOS device 10 is incorporated within a logic circuit, the unexpected parasitic bipolar leakage current flow is known to cause an initial switching delay problem in the logic circuit as reported by Lu et al. in IEEE Journal of Solid State Circuits, vol. 32, no. 8, pages 1241–1253, August 1997. The delay problem only occurs during an activation of the logic circuit after the logic circuit has been idle for more than a few milli-seconds.

The problem is escalated when many devices, such as PD-SOI MOS device 10, of the logic circuit have their sources connected together, such as in a multiplexing circuit. This causes a multiplication of the bipolar leakage current which slows down the switching speed when one of the MOS devices 10 in the multiplexing circuit is activated. This is because all of the generated bipolar leakage current from all the devices must be discharged through a single path, i.e., a path defined by a switch connected to ground (not shown).

The duration of the initial switching delay caused by the current flow depends on several factors, such as the gain of the parasitic bipolar device 80 underneath the body region 50 of the PD-SOI MOS device 10, the threshold voltage of the PD-SOI MOS device 10, the capacitance of the base-emitter junction of the PD-SOI MOS device 10, the stress voltage level, i.e., Vdd, and the number of devices 10 connected together. It has been demonstrated that for an SRAM array, the parasitic bipolar leakage current causes the SRAM array to be up to 20% more slower, than if the leakage current was non-existent.

If the PD-SOI MOS device 10 is incorporated within an SRAM array, a transient bipolar effect is observed due to the parasitic bipolar leakage current as reported by Kuang et al. in IEEE Journal of Solid State Circuits, vol. 32, no. 6, pages 837–844, June 1997. The transient bipolar effect is caused by uneven body stress in the body region 50 of the PD-SOI MOS device 10 which causes a delay of a first write operation within the SRAM array.

The transient bipolar effect has more detrimental effects in an SRAM array utilizing Vdd sensing and having nMOS transfer devices, as opposed to an SRAM array utilizing ground sensing and having pMOS transfer devices. However, SRAM arrays utilizing Vdd sensing and having nMOS devices are more common in SRAM architecture systems, since an SRAM array utilizing Vdd sensing and having nMOS devices is faster than an SRAM array utilizing ground sensing and having pMOS devices due to faster electron mobility than hole mobility.

With reference to FIG. 2, there is illustrated a portion of an SRAM array, designated generally by reference numeral 200, having one bitline BL connected to many SRAM cells, i.e., SRAM cells 210, 220, 230. Each SRAM cell has a pair of transfer transistors 202 and back-to-back inverters 204A and 204B. The SRAM cells in the SRAM array 200 experience the worst transient behavior due to the transient bipolar effect when all the SRAM cells in the array 200 store "high" on one side, and the bitline BL is also precharged "high". At this moment, all the body regions 50 of the transfer transistors 202 are charged up.

Hence, when writing "zero" to a selected SRAM cell, e.g., SRAM cell 210, it will take 20% more time than if all the SRAM cells are stored with "low". This is because, the collective burst of the parasitic bipolar current at the beginning of the first cycle from all the transfer transistors 202, i.e., of all the unselected SRAM cells, e.g., SRAM cells 220, 230 and 240, must be discharged. Also, it should be noted that the body regions 50 of all the unselected transfer transistors 202 are not completely drained of the parasitic bipolar current during the first few cycles of accesses.

If the SRAM array 200 has been idle for a period of time, the body regions 50 of all the transistors 202 are fully charged. Now, when the array 200 is first accessed by activating, for example, the first wordline WL for writing a "low" data, at this moment, because the bitline BL drops from Vdd to ground, the parasitic bipolar leakage current from all the unselected transfer transistors 202 must be discharged through a pull-down device of the data latch 206 and a write driver (not shown). The first access will be significantly slower, as mentioned above, especially if the data latch 206 and the write driver are not sized for the extra bipolar current.

The problem occurs especially on those half-selected cells, e.g., cell 220. The half-selected cells will not have data written, since these columns are not selected for write operations. The worst-case scenario will be when the rest of the cells of the column, e.g., cell 230, are stored with a "high" logic and the half-selected cell is stored with a "low" logic. When the selected wordline WL is activated, the half-selected cell 220 will experience parasitic bipolar leakage current flow from all the rest of the cells attached to the same bitline BL. This will cause flipping of the data stored within the half-selected cell 220 from "low" to "high" during refresh, since the sense amplifier is not sized for taking parasitic bipolar leakage current into consideration.

The uneven altering of the beta ratio during the first access due to threshold voltage lowering of one transfer device 202 (not a pair) will only aggravate the effect. During the stress of the floating gate of one transfer device 202, the value of the beta ratio on one side of the SRAM cell 210 will drop below the originally designed range of 2 to 2.5, and thus the noise margin will be greatly reduced. As a result, reading a zero immediately after the cell is written with a zero after a long stress with a one becomes very difficult.

Some possible solutions to prevent data integrity problems due to parasitic bipolar leakage current are (a) to design the data write drivers and the sense amplifiers with a size that can drain all the parasitic bipolar leakage current during the first access; (b) to utilize ground sensing in combination with pMOS transfer gates; (c) to realize the SRAM array so that the beta ratio will take the initial voltage lowering effect into consideration; (d) to charge monitor and self-discharge the body charges of the transfer devices; (e) or to periodically discharge the bitlines in the SRAM array.

However, as mentioned above, since the behavior to be corrected only occurs during the first access, it is not a wise decision to change the SRAM architecture system in order to compromise SOI performance as must be done to accomplish solutions (b) and (c). To oversize the data driver buffer and the sense amplifier as indicated by solution (a) will increase the chip area and power consumption of the SRAM architecture system. Further, implementing a DRAM-like self-refresh scheme to periodically discharge the body charges, as suggested by solution (d) will require extra and complex circuitry to perform the scheduling of refresh. As for using a charge monitoring circuit, as also suggested by solution (d), the circuit may not effectively drain all the body charges in a single discharge pulse for the entire array.

Solution (e) which entails periodically discharging the bitlines in the array is a feasible and practical solution. Accordingly, the present disclosure provides an SOI SRAM architecture system capable of periodically discharging the array bitlines in the SRAM array to counter data integrity problems due to parasitic bipolar leakage current. The present disclosure further provides an SOI SRAM architecture system capable of charging the array bitlines prior to accessing an SRAM cell within the array.

SUMMARY

An aspect of the present invention is to provide an SRAM architecture system fabricated by silicon-on-insulator (SOI) fabrication technology for overcoming the disadvantages of prior art SOI SRAM architecture systems discussed above.

Another aspect of the present invention is to provide an SOI SRAM architecture system capable of countering data integrity problems due to parasitic bipolar leakage current.

Further, another aspect of the present invention is to provide an SOI SRAM architecture system capable of periodically discharging the array bitlines after the array is idle or in a sleep mode for a period of time to avoid data integrity problems due to parasitic bipolar leakage current.

Further still, another aspect of the present invention is to provide an SOI SRAM architecture system capable of charging the array bitlines to Vdd prior to accessing an SRAM cell.

Accordingly, the present invention provides an SOI SRAM architecture system which holds all the bitlines at a lower voltage level, for example, ground, or a fraction of Vdd, during array idle or sleep mode. Preferably, the bitlines are held at a voltage level approximately equal to Vdd minus Vth, where Vth represents the threshold voltage of the transfer devices of the SRAM cells. This prevents the body regions of the transfer devices of each cell of the array from fully charging up, and thus the system avoids the parasitic bipolar leakage current effects attributed to devices fabricated on a partially-depleted SOI substrate. Also, during idle or sleep mode, if all the bitlines are kept at about the Vdd minus Vth voltage level, power consumption by the SRAM architecture system is decreased. This is because the leakage path via one of the transfer gates of all the SRAM cells is greatly minimized.

In the SOI SRAM architecture system of the present invention, before the SOI SRAM array is first accessed following the idle or sleep mode, the bitlines are quickly brought up to Vdd. Accordingly, there will not be sufficient time for the SOI body regions of the transfer devices to be charged up. Following access of the array, if the array becomes idle for a period of time, the bitlines are discharged to a lower voltage level again. To realize this, the SOI SRAM architecture system of the present invention includes circuitry for receiving at least one signal indicative of the operating mode of the array and for charging and discharging the array bitlines accordingly.

BRIEF DESCRIPTION OF THE FIGURES

FIG. 1A illustrates a prior art nMOS device fabricated on an SOI substrate;

FIG. 1B is a circuit diagram of the nMOS device of FIG. 1A;

FIG. 2 illustrates a portion of a prior art SRAM array;

DETAILED DESCRIPTION OF THE INVENTION

The present invention provides an SRAM architecture system which holds all the bitlines at a lower voltage level, for example, ground, or a fraction of Vdd, during array idle or sleep mode. Preferably, the bitlines are held at a voltage level approximately equal to Vdd minus Vth, where Vth represents the threshold voltage of the transfer devices of the SRAM cells. This prevents the body regions of the transfer devices within each cell of the array from fully charging up, and thus the system avoids the parasitic bipolar leakage current effects attributed to devices fabricated on a partially-depleted silicon-on-insulator (SOI) substrate. Also, during idle or sleep mode, if all the bitlines are kept at about the Vdd minus Vth voltage level, power consumption by the SRAM architecture system is decreased. This is because the leakage path via one of the transfer gates of all the SRAM cells is greatly minimized.

In the SOI SRAM architecture system of the present invention, before the SOI SRAM array is first accessed following the idle or sleep mode, the bitlines are quickly brought up to Vdd. Accordingly, there will not be sufficient time for the SOI body regions of the transfer devices to be charged up. Following access of the array, if the array becomes idle for a period of time, the bitlines are discharged to a lower voltage level again. To realize this, the SOI SRAM architecture system of the present invention includes circuitry for receiving at least one signal indicative of the operating mode of the array and for charging and discharging the array bitlines accordingly, as further described below.

Since the bitlines are held at a voltage level approximately equal to Vdd minus Vth, then the time required to bring all the bitlines in the SRAM array back to Vdd prior to accessing the SRAM array is very short. This design feature makes implementation of the inventive SRAM architecture system practical.

Figure 3:
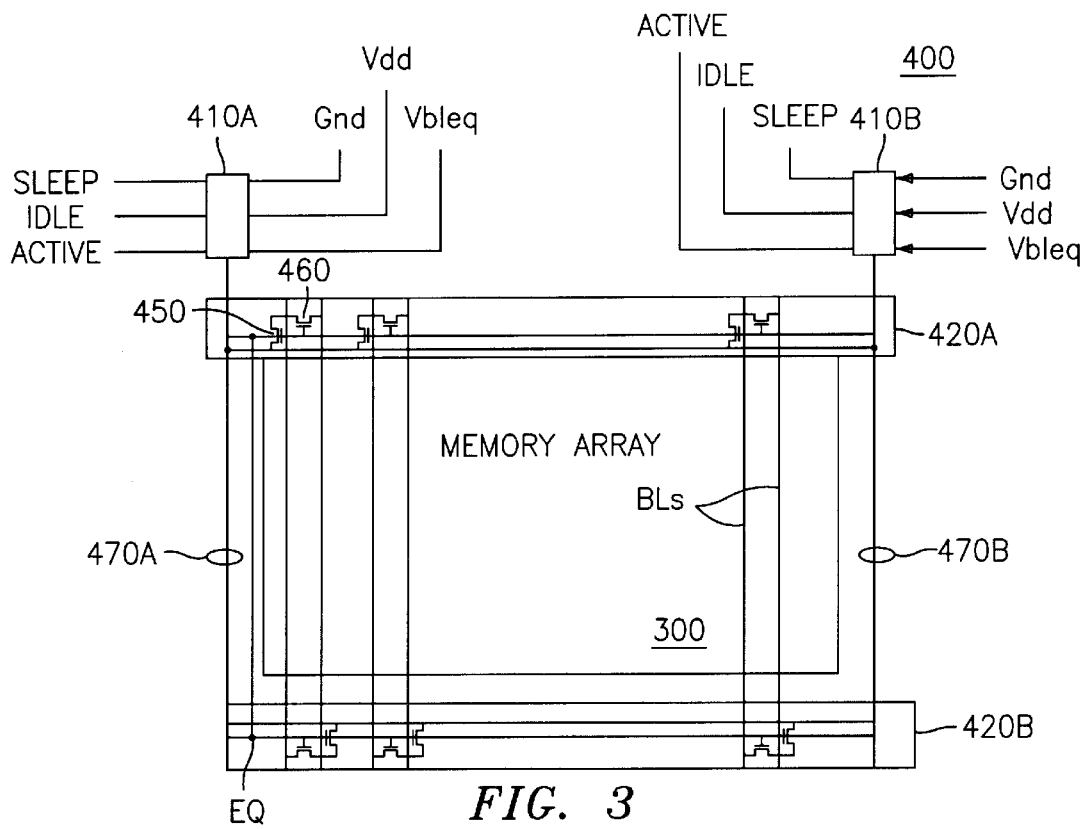
FIG. 3 illustrates an SOI SRAM system according to the present invention.

With reference to FIG. 3, there is illustrated an SOI SRAM architecture system designated generally by reference numeral 400 and having at least one bitline precharge circuit according to the present invention. Preferably, the system 400 includes hierarchical array blocks (only one array block is shown by FIG. 3 and designated by reference numeral 300), so that the bitlines BLs of each array block are quickly brought up to approximately Vdd before the array block is accessed. Vdd represents a supply voltage level indicative of operating the array block 300 in the active mode.

The system 400 includes two bitline precharge circuits 420A and 420B for each array block 300, as shown by FIG. 3, as compared to conventional SRAM systems which typically include three bitline precharge circuits. One bitline precharge circuit 420A is located at one end of the array block 300 and the other bitline precharge circuit 420B is located at the other end of the array block 300.

The bitline precharge circuits 420A and 420B are connected to the bitlines BLs in the array block 300 and to a pair of multiplexers 410A and 410B. As further described below with reference to FIG. 4, the multiplexers 410A and 410B corresponding to each array block 300 are capable of receiving one of three input signals for charging and discharging the bitlines BLs of the array block 300 accordingly. The bitline precharge circuits 420A and 420B are also connected to each other via connections 470A and 470B. The connections 470A and 470B are connected to an output of the multiplexers 410A and 410B, respectively, to allow the predetermined bitline voltage level, e.g., ground, a fraction of Vdd, and Vdd, which is supplied by the multiplexers 410A and 410B to be fed to each bitline precharge circuit 420A and 420B.

Each of the bitline precharge circuits 420A and 420B include at least one charge device 450 connected to then output of each multiplexer for bringing the bitline pairs to the predetermined bitline voltage level and at least one equalization device 460 connected to a corresponding charge device 450 for bringing the bitline pairs to the same voltage level. An equalization signal EQ is provided to the bitline precharge circuits 420A and 420B to activate the bitline precharge circuits 420A and 420B. The equalization signal EQ is preferably provided by the processor or memory controller (not shown).

Figure 4:
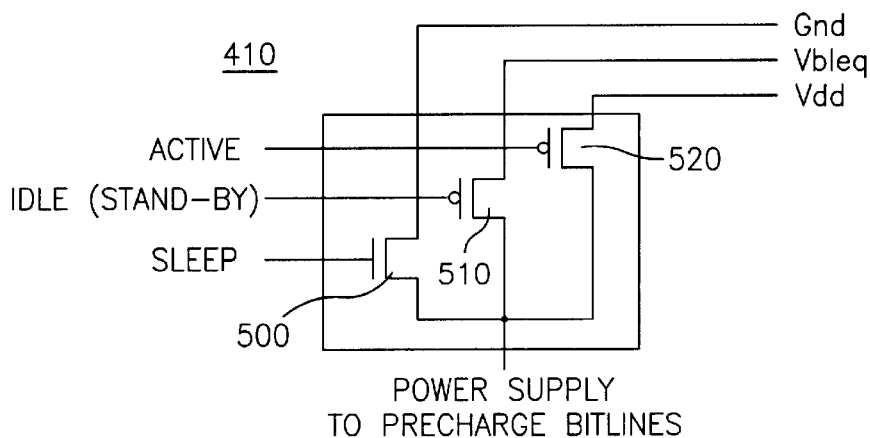
FIG. 4 illustrates a multiplexer of the SOI SRAM system of FIG. 3.

With reference to FIG. 4, the operation of each of the multiplexers 410A and 410B will now be described. As mentioned above each multiplexer 410A and 410B is capable of receiving one of three signals at a particular time. One of the threes signals capable of being received by the multiplexers 410A and 410B is a sleep signal which causes the bitlines BLs to be discharged to ground during sleep mode; for example, when the power is on but the chip which includes the array block 300 is not selected. The sleep signal is received by an NMOS transistor 500 connected to ground. Hence, when the sleep signal is received, i.e., a high sleep signal, the NMOS transistor 500 is activated and the ground voltage level is fed to the bitline precharge circuits 420A and 420B. This causes the bitlines BLs in the array block 300 to be brought to ground. The bitlines BLs are held at ground by continuously transmitting the high sleep signal while the array is in the sleep mode.

The second signal capable of being received by the multiplexers 410A and 410B is an idle or standby signal which causes the bitlines BLs to be charged up to a fraction of Vdd, e.g., ½ Vdd, or a voltage level equal to approximately Vdd minus Vth, during the idle mode, i.e., when the chip is selected but is not in the active mode. The idle signal is received by a PMOS transistor 510 connected to Vbleq, i.e., a fraction of Vdd, e.g., ½ Vdd. Hence, when the idle signal is received, i.e., an active low idle signal, the PMOS transistor 510 is activated and the Vbleq voltage level is fed to the bitline precharge circuits 420A and 420B. This causes the bitlines BLs in the array block 300 to be brought to Vbleq or a fraction of Vdd. The bitlines BLs are held at Vbleq by continuously transmitting the low idle signal while the array is in the idle mode.

The third signal capable of being received by the multiplexers 410A and 410B is an active signal which causes the bitlines BLs of the selected array block 300 to be fully charged up to approximately Vdd prior to the active mode, for example, upon receiving an activation or power-up signal from the processor or memory controller. The active signal is received by a PMOS transistor 520 connected to Vdd. Hence, when the active signal is received, i.e., a low active signal, the PMOS transistor 520 is activated and the Vdd voltage level is fed to the bitline precharge circuits 420A and 420B. This causes the bitlines BLs in the selected array block 300 to be brought to Vdd. The bitlines BLs are held at Vdd by continuously transmitting the low active signal while the array is in the active mode. The precharge circuits 420A and 420B and small size of the array block 300 guarantee that the bitlines BLs are charged up to Vdd instantly and ready for an array read/write operation.

The SRAM architecture system 400 of the present invention avoids transient parasitic bipolar leakage current effects in the SOI SRAM array 300. When the array 300 is in the sleep mode, the bitlines BLs are precharged to a bitline low voltage level, e.g., ground, and held at the low voltage level until the operating mode of the array changes; when the array 300 is in the idle mode, the bitlines BLs are precharged to an intermediate bitline voltage level, e.g., a voltage level equal to approximately Vdd minus Vth, or Vbleq, and held at the intermediate voltage level until the operating mode of the array changes; and when the array 300 is entering the active mode, the bitlines BLs are precharged to a bitline high voltage level, e.g., approximately Vdd, and held at the high voltage level until the operating mode of the array changes. With this arrangement, during a prolonged holding period or array inactivation period, the transfer gates of each SRAM cell do not suffer from body charging as in prior art SRAM architecture systems. As a result, when the array 300 is first accessed for a read or write operation, there are no delays or faults due to parasitic bipolar leakage current. Further, the SRAM system 400, due to the arrangement described above, also saves array standby current.

Figure 5:
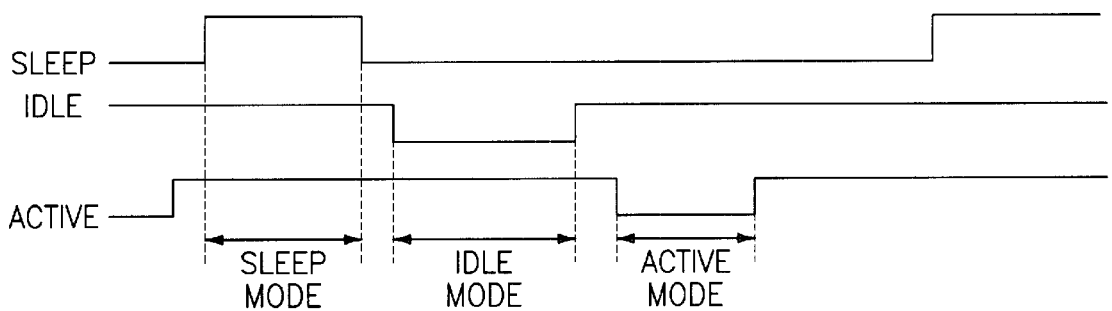
FIG. 5 illustrates waveform end timing diagrams of different operating modes of an SRAM array of the SOI SRAM system of FIG. 3.

FIG. 5 illustrates waveform end timing diagrams of different operating modes of the array block 300 of the SOI SRAM system 400 of FIG. 3. Both the active and idle signals are active low signals, since transistors 510 and 520 are PMOS switches to avoid Vth loss. The sleep signal is an active high signal, since transistor 500 is an NMOS switch for switching to ground. FIG. 5 also illustrates the period that the array is in the sleep mode, the idle mode and the active mode. Control circuitry external to the SOI SRAM system 400 generates these three mutually exclusive control signals to ensure periodic bitline charging/discharging activities, i.e., conditioning of the bitlines BLs, while avoiding direct current flow from one voltage power supply to another.

What has been described herein is merely illustrative of the application of the principles of the present invention. For example, the functions described above and implemented as the best mode for operating the present invention are for illustration purposes only. As a particular example, for instance, other design configurations may be used for the bitline precharge circuit and/or multiplexers which provide similar operation as the bitline precharge circuit and multiplexers described above. Other arrangements and methods may be implemented by those skilled in the art without departing from the scope and spirit of this invention.

We claim:

1. A memory system comprising:
    a plurality of static random access memory (SRAM) cells fabricated on a silicon-on-insulator (SOI) substrate and arranged in an array having a plurality of bitlines and a plurality of wordlines traversing there through; and
    means for conditioning said plurality of bitlines according to a particular mode of said array, said means for conditioning enabled to discharge said plurality of bitlines to a range of voltage levels of a supply voltage provided to said array, the voltage levels including at least an intermediate voltage level approximately equal to one-half the supply voltage level, the voltage level discharged to being dependent on the particular mode.

2. The memory system according to claim 1, wherein said means for conditioning discharges and holds said plurality of bitlines to a low voltage level when said array is in a sleep mode.

3. The memory system according to claim 1, wherein said means for conditioning discharges said plurality of bitlines to the intermediate voltage level when said array is in an idle mode.

4. The memory system according to claim 3, wherein said intermediate voltage level is approximately equal to a supply voltage provided to said array for operating said array in an active mode minus the threshold voltage of transfer devices of said array.

5. The memory system according to claim 1, wherein said means for conditioning charges said plurality of bitlines to a high voltage level when said array is entering an active mode and holds said plurality of bitlines to the high voltage level when said array is in the active mode.

6. The memory system according to claim 1, wherein said means for conditioning includes at least one multiplexer configured for receiving at least two signals indicative of the particular mode of said array, and at least one bitline precharge circuit connected to said at least one multiplexer.

7. The memory system according to claims 6, wherein said at least one bitline precharge circuit includes means for receiving a signal for activating said at least one bitline precharge circuit.

8. The memory system according to claim 6, wherein said at least one bitline precharge circuit includes at least one charge device for charging a corresponding bitline pair of said plurality of bitlines to a predetermined voltage level according to said particular mode of said array.

9. The memory system according to claim 6, wherein said at least one bitline precharge circuit includes at least one equalization device for charging two bitlines of a bitline pair of said plurality of bitlines to approximately an identical voltage level according to said particular mode of said array.

10. The memory system according to claim 6, wherein said at least one multiplexer includes at least two switches each connected to a corresponding voltage level for supplying said plurality of bitlines with said corresponding voltage level via said at least one bitline precharge circuit upon said at least one multiplexer receiving one of said at least two signals.

11. The memory system according to claim 10, wherein each of said at least two switches is either a PMOS or NMOS transistor.

12. The memory system according to claim 1, wherein said substrate is a partially-depleted SOI (PD-SOI) substrate.

13. A method of preventing effects due to parasitic bipolar leakage current in a static random access memory (SRAM) array fabricated on a silicon-on-insulator (SOI) substrate and having a plurality of SRAM cells, said array further having a plurality of bitlines and a plurality of wordlines traversing there through, the method comprising the step of:
    conditioning said plurality of bitlines to a low voltage level when said array is in a sleep mode, to an intermediate voltage level when said array is in an idle mode, and to a high voltage level when said array is in an active mode.

14. The method according to claim 13, further comprising the step of:
    holding said plurality of bitlines at the low voltage level while said array is in the sleep mode, at the interme diate voltage level while said array is in the idle mode, and at the high voltage level while said array is in the active mode.

15. The method according to claim 13, wherein said low voltage level is ground; said intermediate voltage level is approximately equal to a supply voltage provided to said array for operating said array in the active mode minus the threshold voltage of transfer devices of said array, or approximately equal to one-half the supply voltage provided to said array for operating said array in the active mode; and said high voltage level is approximately equal to the supply voltage provided to said array for operating said array in the active mode.

16. The method according to claim 13, wherein said substrate is a partially-depleted SOI (PD-SOI) substrate.

17. The method of claim 13, further comprising:
periodically discharging said plurality of bitlines.

18. The method according to claim 17, wherein said substrate is a partially-depleted SOI (PD-SOI) substrate.

* * * * *